United States Patent
Fukuoka et al.

(10) Patent No.: US 9,295,177 B2
(45) Date of Patent: Mar. 22, 2016

(54) DISPLAY DEVICE

(75) Inventors: Nobuko Fukuoka, Saitama-ken (JP); Arihiro Takeda, Saitama-ken (JP)

(73) Assignee: Japan Display Inc., Tokyo (JP)

( * ) Notice: Subject to any disclaimer, the term of this patent is extended or adjusted under 35 U.S.C. 154(b) by 102 days.

(21) Appl. No.: 13/553,228

(22) Filed: Jul. 19, 2012

(65) Prior Publication Data

US 2013/0182207 A1    Jul. 18, 2013

(30) Foreign Application Priority Data

Jul. 22, 2011  (JP) ................. 2011-160558

(51) Int. Cl.
  *G02F 1/1333* (2006.01)
  *H05K 7/06* (2006.01)
  (Continued)

(52) U.S. Cl.
  CPC .............. *H05K 7/06* (2013.01); *G02F 1/13458* (2013.01); *G02F 1/133345* (2013.01); *C09K 19/56* (2013.01); *G02F 1/0107* (2013.01); *G02F 1/1339* (2013.01); *G02F 1/13394* (2013.01); *G02F 1/133719* (2013.01); *G02F 2001/133357* (2013.01); *H01J 2329/4669* (2013.01); *H01J 2329/863* (2013.01); *H01J 2329/864* (2013.01); *H01J 2329/8625* (2013.01); *H01J 2329/8655* (2013.01); *H05K 7/142* (2013.01); *H05K 2201/10378* (2013.01)

(58) Field of Classification Search
  CPC . G02F 1/13394; G02F 1/1337; G02F 1/1339; G02F 1/133711; G02F 1/133345; G02F 2001/13396; G02F 2001/133357; G02F 1/133305; G02F 2202/02
  See application file for complete search history.

(56) References Cited

U.S. PATENT DOCUMENTS 6,177,152 B1 * 1/2001 Terada et al. ................. 428/1.1
7,648,894 B2 * 1/2010 Moon et al. .................. 438/496
(Continued)

FOREIGN PATENT DOCUMENTS

JP    10-325956    12/1998
JP    11-212100    8/1999
(Continued)

OTHER PUBLICATIONS

U.S. Appl. No. 13/542,049, filed Jul. 5, 2012, Takeda, et al.
(Continued)

*Primary Examiner* — Michael Caley
*Assistant Examiner* — Angela Davison
(74) *Attorney, Agent, or Firm* — Oblon, McClelland, Maier & Neustadt, L.L.P.

(57) ABSTRACT

According to one embodiment, a display device includes a first substrate unit, a second substrate unit, a display layer, and a sealing portion. The first substrate unit includes a first substrate, a display electrode, a terminal portion, and a first insulating layer. The first substrate has a first major surface. The first major surface has a display region and a peripheral region. The display electrode is provided in the display region. The terminal portion is provided in the peripheral region and electrically connected to the display electrode. The first insulating layer is provided on the display and peripheral regions. The second substrate unit faces the first major surface. The display layer is provided between the display electrode and the second substrate unit. The sealing portion is provided between the first and second substrate units. The sealing portion surrounds the display layer and contacts the first insulating layer.

15 Claims, 8 Drawing Sheets (51) Int. Cl.
*G02F 1/1345* (2006.01)
*G02F 1/1339* (2006.01)
*G02F 1/1337* (2006.01)
*G02F 1/141* (2006.01)
*G02F 1/01* (2006.01)
*C09K 19/56* (2006.01)
*H05K 7/14* (2006.01)

(56) References Cited

U.S. PATENT DOCUMENTS

| | | | |
|---|---|---|---|
| RE41,732 E * | 9/2010 | Hasegawa et al. | 349/58 |
| 2004/0165132 A1 * | 8/2004 | Tomioka et al. | 349/123 |
| 2007/0211202 A1 * | 9/2007 | Ishii et al. | 349/153 |
| 2010/0193775 A1 * | 8/2010 | Yutani et al. | 257/40 |

FOREIGN PATENT DOCUMENTS

| | | |
|---|---|---|
| JP | 2000-105377 | 4/2000 |
| JP | 2003-222880 | 8/2003 |
| JP | 2006-10856 | 1/2006 |
| JP | 2006-106076 | 4/2006 |
| JP | 2007-10888 | 1/2007 |
| JP | 2008-280215 | 11/2008 |

OTHER PUBLICATIONS

U.S. Appl. No. 13/562,647, filed Jul. 31, 2012, Takeda, et al.

Japanese Office Action issued May 13, 2014, in Japan patent Application No. 2011-160558 (with English translation), English language portion only.

* cited by examiner

DISPLAY DEVICE

CROSS-REFERENCE TO RELATED APPLICATIONS

This application is based upon and claims the benefit of priority from the prior Japanese Patent Application No. 2011-160558, filed on Jul. 22, 2011; the entire contents of which are incorporated herein by reference.

FIELD

Embodiments described herein relate generally to a display device.

BACKGROUND

For example, there is a liquid crystal display device having liquid crystals sandwiched between two substrates. There is an organic light emitting display device having an organic light emitting layer sealed between two substrates. In such display devices, a display layer such as a liquid crystal layer and an organic light emitting layer is sealed with a sealant. However, water or the like externally enters the display layer to sometimes cause display unevenness. Display unevenness degrades the reliability of display devices.

DETAILED DESCRIPTION

According to one embodiment, a display device includes a first substrate unit, a second substrate unit, a display layer, and a sealing portion. The first substrate unit includes a first substrate, a display electrode, a terminal portion, and a first insulating layer. The first substrate has a first major surface. The first major surface has a display region and a peripheral region on an outer side of the display region. The display electrode is provided in the display region. The terminal portion is provided in the peripheral region and directly or indirectly electrically connected to the display electrode. The first insulating layer is provided on the display region and the peripheral region. The first insulating layer covers the display electrode while exposing at least a part of the terminal portion. The first insulating layer contains polysiloxane. The second substrate unit faces the first major surface. The display layer is provided between the display electrode and the second substrate unit. The sealing portion is provided between the first substrate unit and the second substrate unit. The sealing portion surrounds the display layer and contacts the first insulating layer. An outer edge of the sealing portion is located on an inner side of an outer edge of the first insulating layer.

Various embodiments will be described hereinafter with reference to the accompanying drawings.

It is noted that the drawings are schematic or conceptual. The relationship between the thicknesses and widths of portions, a ratio of size between portions, or the like are not necessarily the same as real ones. Moreover, even in the case of expressing the same portions, dimensions and ratios between the portions are sometimes expressed differently depending on the drawings.

In the specification and drawings, components similar to those described or illustrated in a drawing thereinabove are marked with the identical reference numerals, and a detailed description is omitted as appropriate.

First Embodiment

Figure 1A:
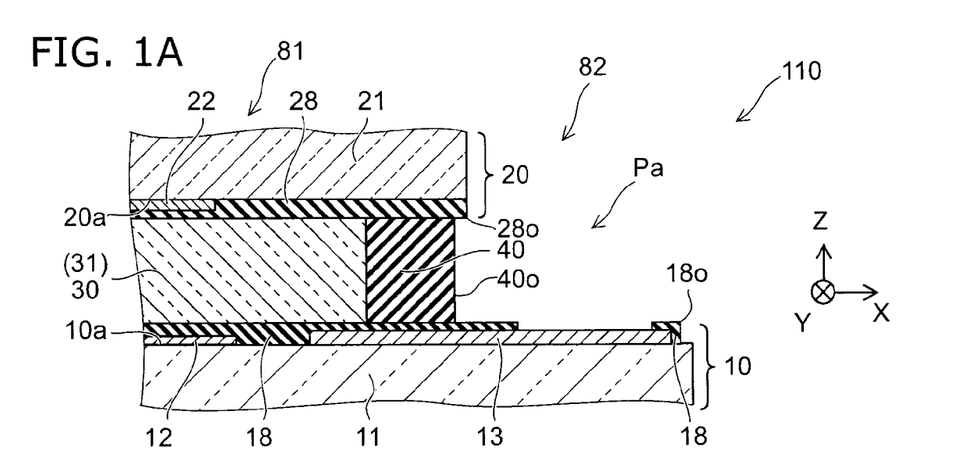
FIG. 1A to FIG. 1C are schematic cross-sectional views illustrating the configuration of a display device according to a first embodiment.
Figure 1B:
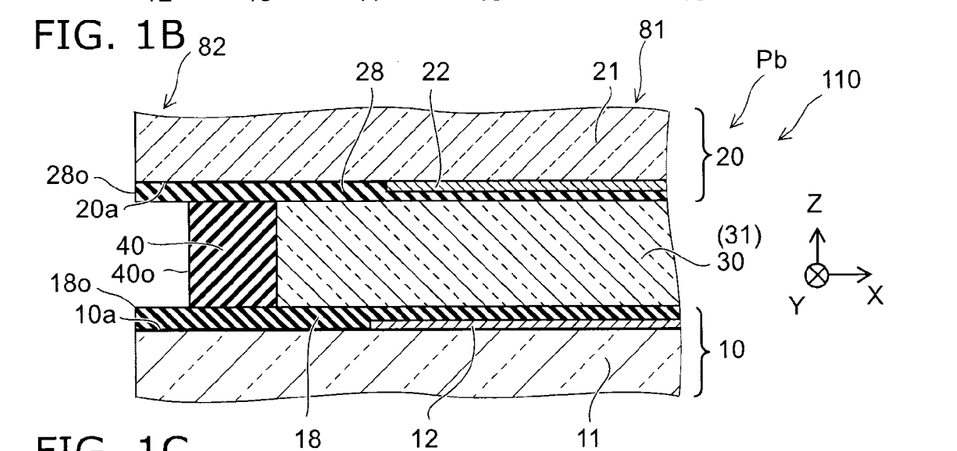
Figure 1C:
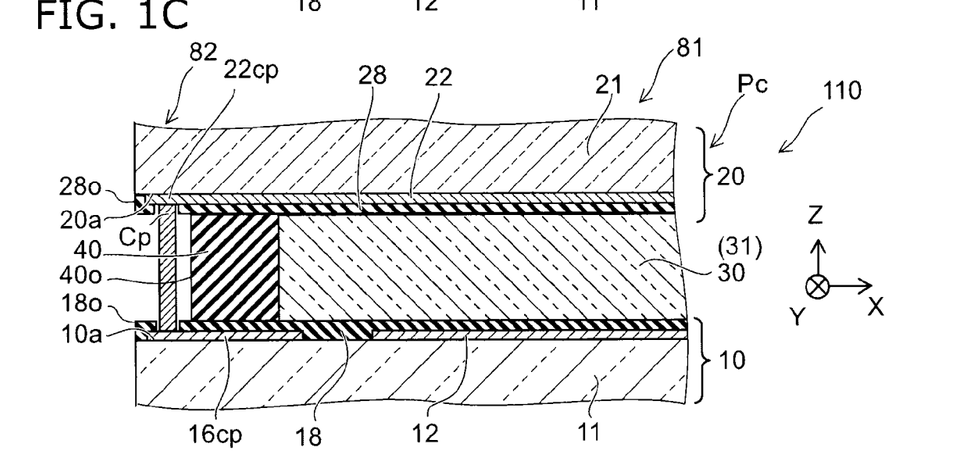

FIG. 1A to FIG. 1C are schematic cross-sectional views illustrating the configuration of a display device according to a first embodiment.

Figure 2A:
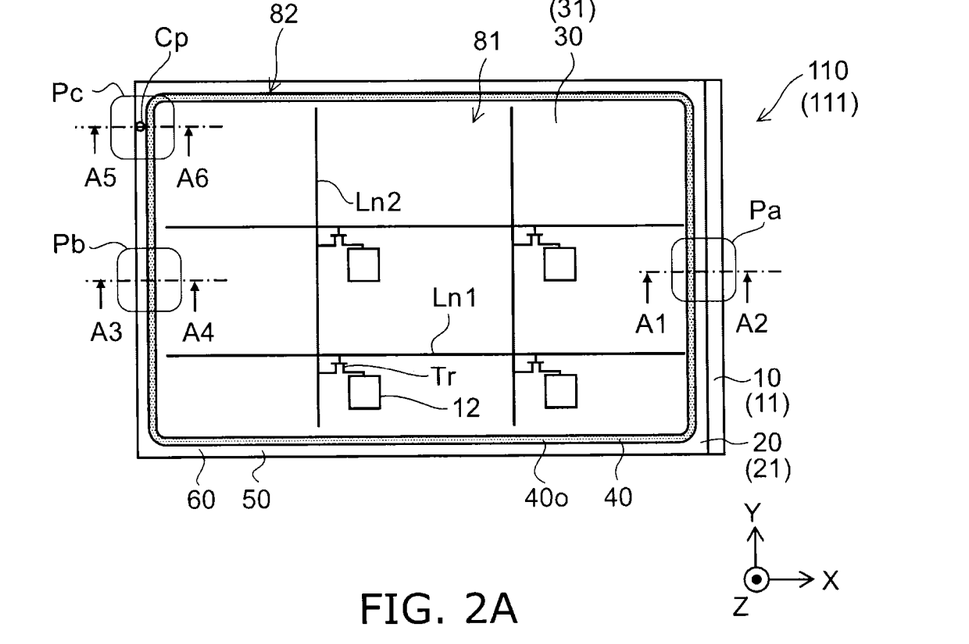
FIG. 2A and FIG. 2B are schematic plan views illustrating the configuration of the display device according to the first embodiment.
Figure 2B:
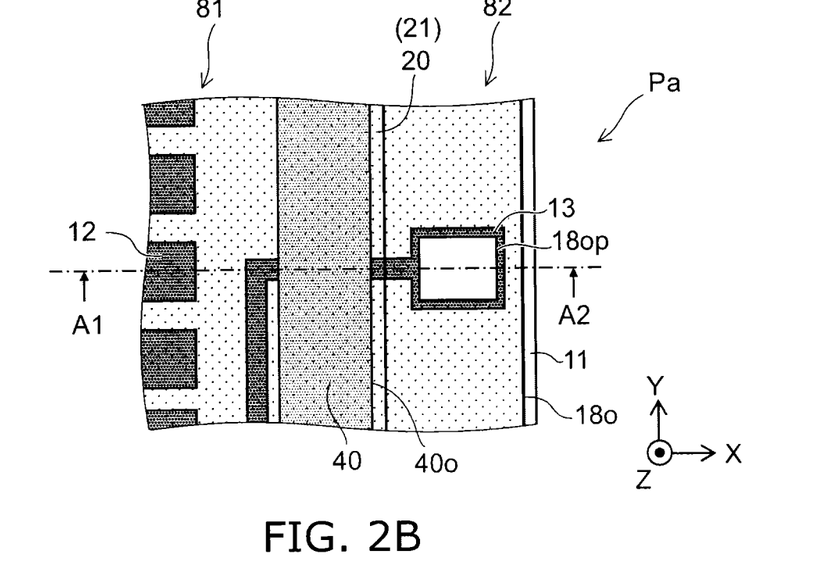

FIG. 2A and FIG. 2B are schematic plan views illustrating the configuration of the display device according to the first embodiment.

FIG. 1A is a diagram related to a first portion Pa in FIG. 2A, and a cross-sectional view on a line A1-A2. FIG. 1B is a diagram related to a second portion Pb in FIG. 2A, and a cross-sectional view on a line A3-A4. FIG. 1C is a diagram related to a third portion Pc in FIG. 2A, and a cross-sectional view on a line A5-A6. FIG. 2B is a partially enlarged plan view related to the first portion Pa in FIG. 2A.

As shown in FIG. 1A to FIG. 1C and FIG. 2A, a display device 110 according to the embodiment includes a first substrate unit 10, a second substrate unit 20, a display layer 30, and a sealing portion 40.

The first substrate unit 10 includes a first substrate 11, a display electrode 12, a terminal portion 13, and a first insulating layer 18. The first substrate 11 has a first major surface 10a. The first major surface 10a has a display region 81 and a peripheral region 82 on the outer side of the display region 81.

The display electrode 12 is provided in the display region 81.

The terminal portion 13 is provided in the peripheral region 82. The terminal portion 13 is electrically connected to the display electrode 12 directly or indirectly.

The first insulating layer 18 covers the display electrode 12 while exposing at least a part of the terminal portion 13. The first insulating layer 18 is provided on the display region 81 and the peripheral region 82. The first insulating layer 18 contains polysiloxane.

It is noted that in the specification and drawings, "a state in which a component is provided on another component" includes a state in which a component is provided to directly contact another component and a state in which a component is provided above another component as a different element is inserted therebetween".

The second substrate unit 20 faces the first major surface 10a.

The display layer 30 is provided between the display electrode 12 and the second substrate unit 20.

It is noted that in the specification and drawings, "a state in which a component faces another component" includes a state in which a component directly faces another component and a state in which a component faces another component as a different element is inserted therebetween.

The sealing portion 40 is provided between the first substrate unit 10 and the second substrate unit 20. The sealing portion 40 surrounds the display layer 30 and contacts the first insulating layer 18. For the sealing portion 40, a thermosetting resin or UV hardening resin, for example, is used.

An outer edge 40o of the sealing portion 40 is located on the inner side of an outer edge 18o of the first insulating layer 18. Namely, the first insulating layer 18 extends on the outer side of the sealing portion 40.

Here, suppose that an axis along a direction from the first substrate unit 10 to the second substrate unit 20 is a Z-axis (a first axis, for example). Suppose that a single axis vertical to the Z-axis is an X-axis (a second axis, for example). Suppose that an axis vertical to the Z-axis and the X-axis is a Y-axis (a third axis, for example).

The planar configurations when the display device 110 is seen along the Z-axis are a rectangle, for example. However, in the embodiment, the shape of the display device 110 is optional. In the following, a description will be given in which the shape (the planar configurations) of the display device 110 is a rectangle.

A single side of the rectangular planar configurations when the display device 110 is seen along the Z-axis is parallel with the X-axis, for example. A different side connected to this side is parallel with the Y-axis, for example.

As shown in FIG. 2A, the first substrate unit 10 can further include a scanning line Ln1 (a second interconnection), a signal line Ln2 (a first interconnection), and a switching element Tr provided on the first major surface 10a of the first substrate 11. The scanning line Ln1 extends along the X-axis, for example. The scanning line Ln1 can be provided in multiple numbers. Each of a plurality of scanning lines Ln1 extends along the X-axis. The signal line Ln2 extends along the Y-axis, for example. The signal line Ln2 can be provided in multiple numbers. A plurality of signal lines Ln2 extend along the Y-axis, for example. The switching element Tr is provided at a portion where the scanning line Ln1 cross the signal line Ln2. The switching element Tr is provided in multiple numbers. Each of a plurality of switching elements Tr is disposed at a portion where the plurality of scanning lines Ln1 cross the plurality of signal lines Ln2. It is noted that an auxiliary capacitance line extending along the X-axis (not shown) may be further provided.

A transistor, for example, is used for the switching element Tr. A thin film transistor, for example, is used for the transistor. The gate of the switching element Tr is connected to the scanning line Ln1, for example. One of the source and drain of the switching element Tr is connected to the signal line Ln2, for example. The other of the source and drain of the switching element Tr is connected to the display electrode 12, for example. The display device 110 is an active matrix display device.

The display device 110 is a liquid crystal display device, for example. In this case, a liquid crystal layer 31, for example, is provided in the display layer 30. The embodiment is not limited thereto, and a given method can be used for the display device 110. For example, in the case where the display device 110 is an organic electroluminescent display device, an organic light emitting layer is used for the display layer 30. In the following, the case will be described where the liquid crystal layer 31 is used for the display layer 30.

As shown in FIG. 1A to FIG. 1C, in this example, the second substrate unit 20 includes a second substrate 21 and a second insulating layer 28. The second substrate 21 faces the first major surface 10a of the first substrate 11. Namely, the second substrate 21 has a second major surface 20a facing the first major surface 10a. The second insulating layer 28 is provided on the second major surface 20a. The second insulating layer 28 contains polysiloxane. The sealing portion 40 contacts the second insulating layer 28. For example, the outer edge 40o of the sealing portion 40 is located on the inner side of an outer edge 28o of the second insulating layer 28. Namely, the second insulating layer 28 extends on the outer side of the sealing portion 40.

In this example, a counter electrode 22 is provided in the second substrate unit 20. The second insulating layer 28 covers the counter electrode 22. For example, a voltage is applied between the display electrode 12 and the counter electrode 22 to apply the voltage to the display layer 30 (the liquid crystal layer 31, for example). Thus, the optical characteristics of the display layer 30 are changed, or light is emitted for display.

However, the counter electrode 22 may be provided in the first substrate unit 10. In this case, an electric field having a component horizontal to the X-Y plane is applied to the display layer 30, and the optical characteristics of the display layer 30 are changed, or light is emitted for display.

The counter electrode 22 is provided in at least any one of the second substrate unit 20 and the first substrate unit 10, for example. The display electrode 12 and the counter electrode 22 may have a comb tooth shape.

As described above, in the display device 110, the first insulating layer 18 is provided on the uppermost surface of the first substrate unit 10, and the second insulating layer 28 is provided on the uppermost surface of the second substrate unit 20. The sealing portion 40 contacts the first insulating layer 18 and the second insulating layer 28. These insulating layers contain polysiloxane.

Thus, it is possible to suppress the entry of water or the like (including conductive impurities or the like), for example, into the display layer 30 externally through the first insulating layer 18 and the second insulating layer 28. The coupling between the first insulating layer 18 and the first substrate 11 is strong. The coupling between the second insulating layer 28 and the second substrate 21 is also strong. Thus, it is possible to suppress the entry of water or the like, for example, into the display layer 30 externally through the interface between the first insulating layer 18 and the first substrate 11, and the interface between the second insulating layer 28 and the second substrate 21. The coupling between the first insulating layer 18 and the sealing portion 40 is strong. The coupling between the second insulating layer 28 and the sealing portion 40 is strong. Thus, it is possible to suppress the entry of water or the like, for example, into the display layer 30 through the interface between the first insulating layer 18 and the sealing portion 40. It is also possible to suppress the entry of water or the like, for example, into the display layer 30 through the interface between the second insulating layer 28 and the sealing portion 40. Accordingly, it is possible to provide a highly reliable display device.

The thickness of the first insulating layer 18 is 10 nanometers (nm) or more and 1,000 nm or less, for example. More specifically, the thickness of the first insulating layer 18 is 50 nm or more and 200 nm or less, for example.

The first insulating layer 18 is provided almost entirely on the first major surface 10a of the first substrate 11, for example. However, the terminal portion 13 is provided on the first substrate 11 for electrical connection. At least a part of the terminal portion 13 is exposed from the first insulating layer 18.

As shown in FIG. 2B, an opening 18op is provided in the first insulating layer 18. At least a part of the terminal portion 13 is exposed from the opening 18op.

The terminal portion 13 is electrically connected to the display electrode 12 through the signal line Ln2 and the switching element Tr, for example. Namely, the terminal portion 13 is indirectly electrically connected to the display electrode 12. When the switching element Tr is in the ON state, the terminal portion 13 is electrically connected to the display electrode 12. In the embodiment, the terminal portion 13 may be directly electrically connected to the display electrode 12. At least a part of the terminal portion 13 is exposed from the first insulating layer 18 to connect the terminal portion 13 to the outside.

It is noted that as shown in FIG. 2B, in this example, the outer edge 180 of the first insulating layer 18 is provided on the inner side of the end surface of the first substrate 11. However, the outer edge 180 of the first insulating layer 18 may extend to the end surface of the first substrate 11.

As shown in FIG. 1C, the second substrate unit 20 can further include a second connecting portion 22cp, for example. The second connecting portion 22cp is connected to the counter electrode 22, for example. The second connecting portion 22cp has a portion on the outer side of the sealing portion 40. At least a part of the second connecting portion 22cp is exposed from the second insulating layer 28.

On the other hand, as shown in FIG. 1C, the first substrate unit 10 further includes a first connecting portion 16cp. The first connecting portion 16cp has a portion on the outer side of the sealing portion 40. At least a part of the first connecting portion 16cp is exposed from the first insulating layer 18. It is noted that the first connecting portion 16cp may be considered to be a part of the terminal portion 13. For example, a plurality of terminal portions 13 are provided, and a part of the plurality of terminal portions 13 is electrically (directly or indirectly) connected to the first connecting portion 16cp.

The display device 110 further includes a connecting member Cp (a transfer, for example). The connecting member Cp is electrically connected to the first connecting portion 16cp and the second connecting portion 22cp. Thus, the potential of the counter electrode 22 is transferred to the first substrate unit 10 through the second connecting portion 22cp, the connecting member Cp, and the first connecting portion 16cp. Thus, for example, the counter electrode 22 is electrically connected to the outside through the terminal portion 13 provided in the first substrate unit 10.

As already described, the display layer 30 can include the liquid crystal layer 31. The first insulating layer 18 contacts the liquid crystal layer 31, and the second insulating layer 28 contacts the liquid crystal layer 31. The first insulating layer 18 and the second insulating layer 28 can align liquid crystals in the liquid crystal layer 31. The first insulating layer 18 and the second insulating layer 28 define the direction of a director of liquid crystals in the liquid crystal layer 31 when no voltage is applied to the liquid crystal layer 31. The first insulating layer 18 and the second insulating layer 28 have the function of an alignment film for liquid crystals, for example.

The first insulating layer 18 (and the second insulating layer 28) contains polysiloxane including an organic group, and can align liquid crystals in the liquid crystal layer 31. In order to obtain a desired pretilt angle of liquid crystals, a desired structure can be used for the organic group. The pretilt angle of liquid crystals is an angle between the first major surface 10a and the director of liquid crystals, for example. The pretilt angle of liquid crystals can have a given angle of 0 degree or more and 90 degrees or less.

In the liquid crystal display device, there is a configuration in which polyimide is used for an alignment film. In this case, when the outer edge of the alignment film is located on the outer side of the sealing portion 40, reliability is degraded. It can be considered that this is because water or the like enters the display layer 30 through a polyimide film, for example, when the outer edge (the end) of the polyimide alignment film is located on the outer side of the sealing portion 40. Therefore, the outer edge (the end) of the polyimide alignment film is disposed on the inner side of the sealing portion 40. Namely, for example, the polyimide alignment film is disposed so as not to lie on the sealing portion 40. In a liquid crystal display device in which the region of a picture frame on the outer side of the display region is narrowed, the polyimide alignment film is sometimes disposed so as to lie on the sealing portion 40. However, also in this configuration, the outer edge (the end) of the polyimide alignment film is disposed on the inner side of the outer edge 400 of the sealing portion 40. Namely, the polyimide alignment film does not extend on the outer side of the sealing portion 40.

However, according to experiments conducted by the inventors, it was revealed that also in these configurations, display unevenness (also including burn-in or the like) occurs in a region close to the sealing portion 40 of the display layer 30 in a burn-in test at high temperature and high humidity, for example. Moreover, in some cases, interconnections corrode, for example. It can be considered that this is because water or the like enters the display layer 30 through the interface between a portion contacting the sealing portion 40 of the first substrate unit 10 (an interlayer insulating film or the like, described later, for example) and the sealing portion 40, for example.

On the contrary, in the display device 110 according to the embodiment, the first insulating layer 18 and the second insulating layer 28 containing polysiloxane extend on the outer side of the sealing portion 40. The display electrode 12 and the counter electrode 22 are entirely covered with the first insulating layer 18 and the second insulating layer 28. The sealing portion 40 contacts the first insulating layer 18 and the second insulating layer 28. The strength of the coupling between the sealing portion 40 and the first insulating layer 18 is high, and the strength of the coupling between the sealing portion 40 and the second insulating layer 28 is high. Consequently, the entry of water or the like into the display layer 30 is suppressed. Thus, it is possible to provide a highly reliable display device.

The display device 110 can be manufactured in which the first insulating layer 18 and the second insulating layer 28 are formed on the first substrate 11 and the second substrate 21, respectively, by a method such as printing, for example. Namely, since the display device 110 can be manufactured by printing a material to be the first insulating layer 18 and the second insulating layer 28 instead of an alignment film, high productivity can be maintained without increasing the number of process steps. Moreover, the first insulating layer 18 and the second insulating layer 28 are formed on the major surface of a substrate to be a base of a plurality of display devices, whereby a plurality of display devices can be collectively manufactured.

As described above, in the embodiment, an inorganic alignment film containing polysiloxane (an organopolysiloxane film, for example) is used to cover the first substrate 11 and the second substrate 21 to the outer side of the sealing portion 40 (except the terminal portion 13, the first connecting portion 16cp, and the second connecting portion 22cp) with the alignment film, thereby improving reliability.

On the other hand, there is a configuration in which a silane coupling agent is used for an alignment film. For an example of using an inorganic film for an alignment film, there is an obliquely evaporated film made of silicon oxide. The thickness of the alignment film made of a silane coupling agent is very thin. The obliquely evaporated film made of silicon oxide is porous. Thus, these alignment films do not electrically function as an insulating layer. Therefore, in the case of using such alignment films, an alignment film may be provided entirely on the substrate surface including the terminal portion 13, the first connecting portion 16cp, and the second connecting portion 22cp. However, in these alignment films, alignment stability is low, so that these alignment films are impractical.

On the contrary, in the embodiment, alignment stability is high because polysiloxane is used. Polysiloxane makes a strong film to suppress the entry of water or the like. Polysiloxane functions as an insulating layer. Therefore, in the embodiment, the polysiloxane insulating layer is substantially entirely provided on the substrate except portions where electrical connection is provided, for example. Namely, this insulating layer extends on the outer side of the sealing portion 40. Accordingly, it is possible to obtain a highly reliable, practical display device.

Figure 3A:
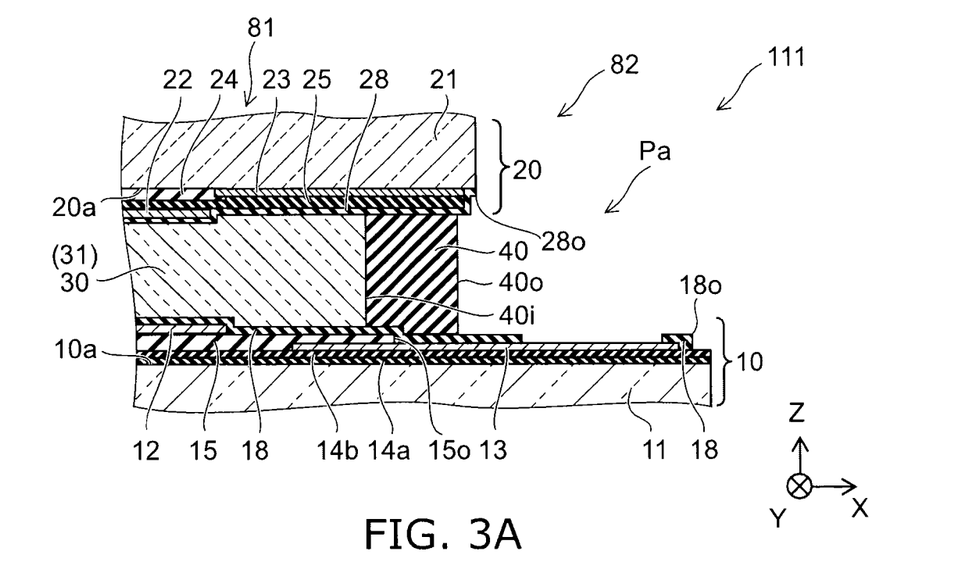
FIG. 3A and FIG. 3B are schematic cross-sectional views illustrating the configuration of another display device according to the first embodiment.
Figure 3B:
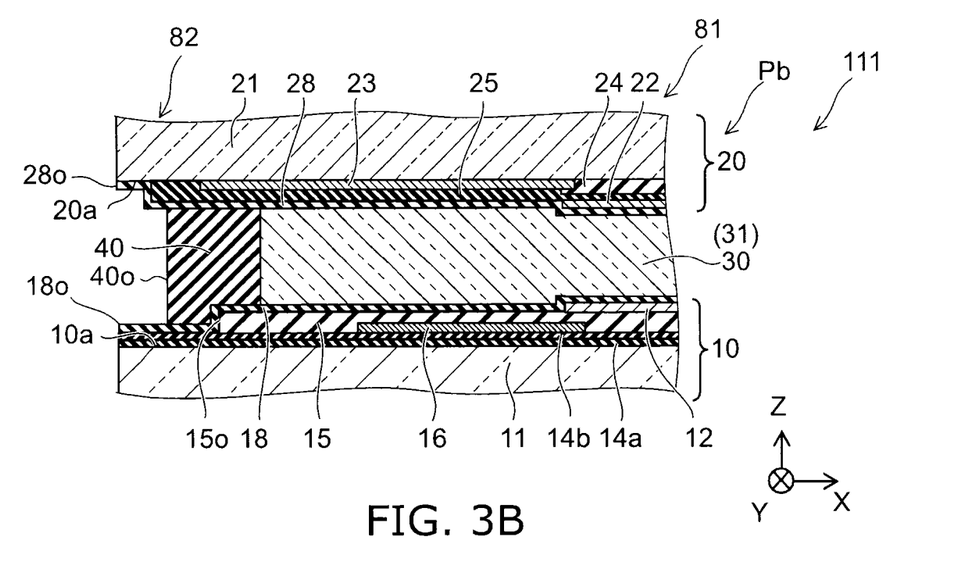

FIG. 3A and FIG. 3B are schematic cross-sectional views illustrating the configuration of another display device according to the first embodiment.

These drawings illustrate the configuration of a display device 111 that is one example of the display device according to the embodiment. FIG. 3A is a diagram corresponding to the first portion Pa in FIG. 2A, and corresponding to the cross section on the line A1-A2. FIG. 3B is a diagram corresponding to the second portion Pb in FIG. 2A, and corresponding to the cross section on the line A3-A4.

As shown in FIG. 3A and FIG. 3B, in the display device 111 according to the embodiment, a first substrate unit 10 further includes a first insulating film 14a, a second insulating film 14b, an interlayer insulating film 15, and a circuit unit 16.

The first insulating film 14a is provided on a first major surface 10a of the first substrate 11. The second insulating film 14b is provided on the first insulating film 14a. For example, any one of a scanning line Ln1 and a signal line Ln2 is provided between the first substrate 11 and the first insulating film 14a. The other of the scanning line Ln1 and the signal line Ln2 is provided between the first insulating film 14a and the second insulating film 14b. The portions of a switching element Tr are covered with at least any one of the first insulating film 14a and the second insulating film 14b, for example. For the first insulating film 14a and the second insulating film 14b, silicon oxide, silicon nitride, silicon oxynitride, or the like, for example, is used. However, in the embodiment, a given insulating material can be used for the first insulating film 14a and the second insulating film 14b.

The interlayer insulating film 15 is disposed between the second insulating film 14b and a display electrode 12. A through hole, not shown, is provided in the interlayer insulating film 15. The switching element Tr is electrically connected to the display electrode 12 through the through hole. For the interlayer insulating film 15, an organic material such as an acrylic resin, for example, is used. The interlayer insulating film 15 has the function of a planarization film, for example. The thickness of the interlayer insulating film 15 is relatively thick.

For the circuit unit 16, for example, a semiconductor film used for the switching element Tr is used. For example, for the switching element Tr and the circuit unit 16, polysilicon is used.

A first insulating layer 18 covers the first insulating film 14a, the second insulating film 14b, the interlayer insulating film 15, the circuit unit 16, and the display electrode 12. It is noted that also in this case, at least a part of a terminal portion 13 is exposed from the first insulating layer 18.

A second substrate unit 20 can further include a shielding layer 23, a color layer 24, and an overcoat layer 25. The shielding layer 23 is provided on a second major surface 20a of a second substrate 21. The shielding layer 23 shields portions other than portions facing the display electrode 12 (portions between a plurality of display electrodes 12, a peripheral region 82, or the like, for example). The color layer 24 faces the display electrode 12, for example. The color layer 24 is provided in multiple numbers. A plurality of color layers 24 are blue, green, or red, for example. However, in the embodiment, the configuration of the color layer is optional. The overcoat layer 25 is provided on the shielding layer 23 and the color layer 24. A counter electrode 22 is provided on the overcoat layer 25, for example. A second insulating layer 28 is provided on the counter electrode 22 and the overcoat layer 25.

The second insulating layer 28 covers the shielding layer 23, the color layer 24, the overcoat layer 25, and the counter electrode 22.

Also in this case, a sealing portion 40 contacts the first insulating layer 18. An outer edge 40o of the sealing portion 40 is located on the inner side of an outer edge 18o of the first insulating layer 18. The sealing portion 40 contacts the second insulating layer 28. The outer edge 40o of the sealing portion 40 is located on the inner side of an outer edge 28o of the second insulating layer 28.

It is noted that although not illustrated in the drawing, also in this case, the second substrate unit 20 can have a second connecting portion 22cp, and the first substrate unit 10 can have a first connecting portion 16cp. The display device 111 can further include a connecting member Cp. At least a part of the second connecting portion 22cp is exposed from the second insulating layer 28 on the outer side of the sealing portion 40. At least a part of the first connecting portion 16cp is exposed from the first insulating layer 18 on the outer side of the sealing portion 40.

For example, the first insulating layer 18 substantially entirely covers the first major surface 10a except the terminal portion 13 and the first connecting portion 16cp. The second insulating layer 28 substantially entirely covers the second major surface 20a except the second connecting portion 22cp. Thus, it is possible to provide a highly reliable display device.

Also in this case, polysiloxane having an organic group is used for the first insulating layer 18 and the second insulating layer 28, and the first insulating layer 18 and the second insulating layer 28 can function as an alignment film for a display layer 30 (a liquid crystal layer 31).

For example, in a reference sample in which polyimide is used for an alignment film and the outer edge of the alignment film is located on the inner side of an outer edge 40o of a sealing portion 40, it was revealed that display unevenness tends to occur in a region close to the sealing portion 40 of a display layer 30 in a burn-in test at high temperature and high humidity.

In this reference sample, the edge of a first insulating film 14a, the edge of a second insulating film 14b, and the edge of an interlayer insulating film 15 are not covered with the alignment film. Namely, for example, the ends of the first insulating film 14a, the second insulating film 14b, and the interlayer insulating film 15 are disposed under the sealing portion 40, or exposed on the outer side of the sealing portion 40. Therefore, it can be considered that water or the like tends to enter the display layer 30 through the first insulating film 14a, the second insulating film 14b, the interlayer insulating film 15, and the interfaces therebetween. Moreover, it can be considered that water or the like tends to enter the display layer 30 through a shielding layer 23, a color layer 24, an overcoat layer 25, and the interfaces therebetween.

The inventors conducted a burn-in test at high temperature and high humidity on a display device in a configuration which an outer edge 400 of a sealing portion 40 is located on the inner side of the outer edge of a polyimide film (namely, in a configuration in which the outer edge of the polyimide film is locoed on the outer side of the sealing portion 40) in the case where the polyimide film is used for an alignment film. Consequently, display unevenness occurred in a region close to the sealing portion 40 of a display layer 30. It can be considered that this is because water or the like enters the display layer 30 through the polyimide film (and the interface between the polyimide film and the sealing portion 40).

On the contrary, in the display device 111 according to the embodiment, such display unevenness does not occur in this test. In the embodiment, polysiloxane is used for the first insulating layer 18 and the second insulating layer 28 functioning as an alignment film. Thus, water or the like is difficult to enter the display layer 30 through the first insulating layer 18 and the second insulating layer 28 (and the interfaces between the sealing portion 40 and the first insulating layer 18 and between the sealing portion 40 and the second insulating layer 28). Moreover, the first insulating layer 18 covers the first insulating film 14a, the second insulating film 14b, the interlayer insulating film 15, the circuit unit 16, and the display electrode 12, and the second insulating layer 28 covers the shielding layer 23, the color layer 24, the overcoat layer 25, and the counter electrode 22. Therefore, it is possible to suppress the entry of water or the like into the display layer 30 through these films, these layers, and the interfaces therebetween. According to the embodiment, it is possible to improve reliability.

In the display device 111, the first substrate unit 10 further includes the interlayer insulating film 15 provided between the first substrate 11 and the display electrode 12. An outer edge 150 of the interlayer insulating film 15 is located on the inner side of the outer edge 40o of the sealing portion 40. Thus, the end (the outer edge 15o) of the interlayer insulating film 15 is located on the inner side of the sealing portion 40, and higher reliability can be obtained.

Figure 4A:
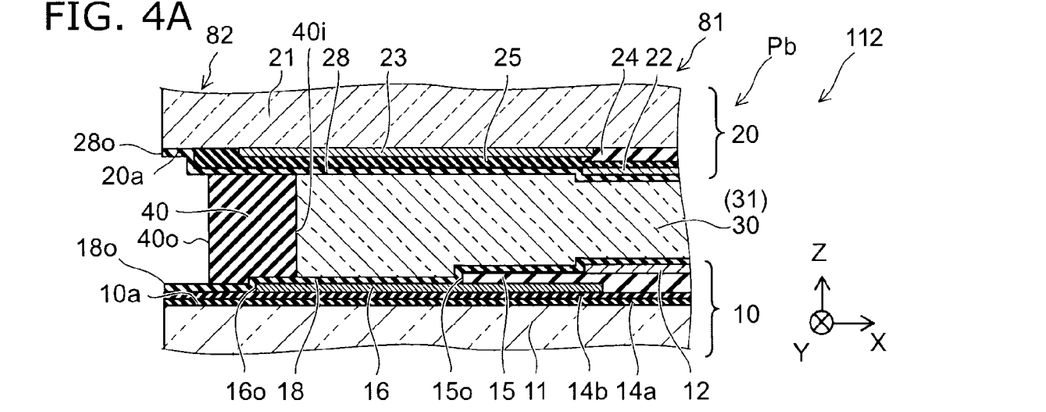
FIG. 4A to FIG. 4C are schematic cross-sectional views illustrating the configurations of other display devices according to the first embodiment.
Figure 4B:
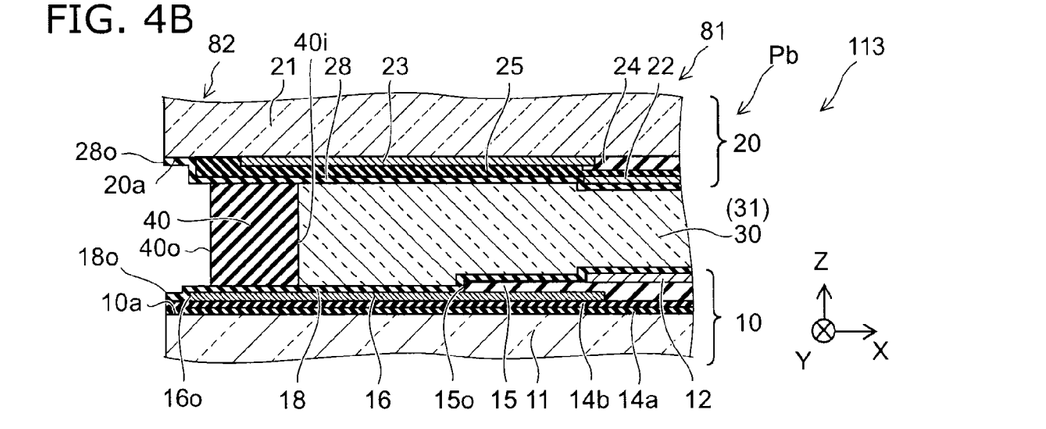
Figure 4C:
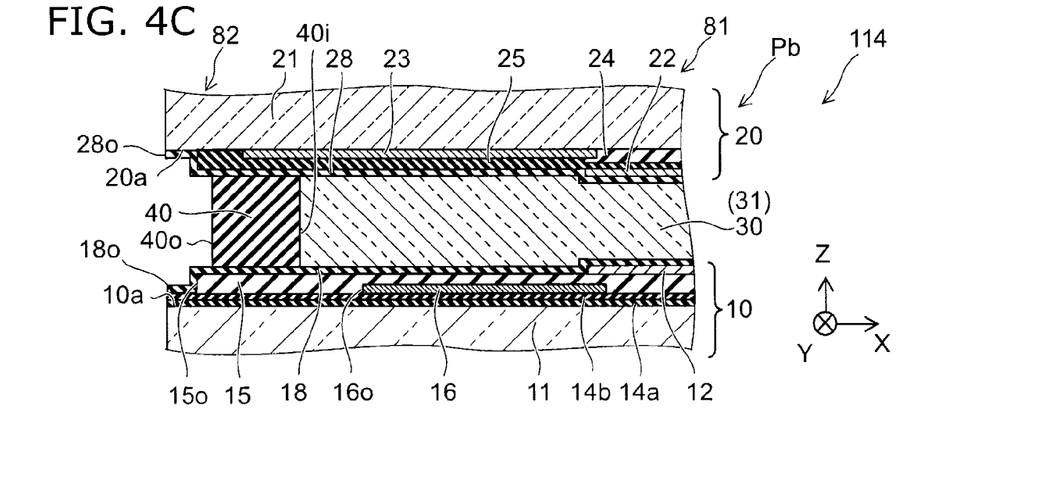

FIG. 4A to FIG. 4C are schematic cross-sectional views illustrating the configurations of other display devices according to the first embodiment.

These drawings are diagrams corresponding to the second portion Pb in FIG. 2A, and corresponding to the cross section on the line A3-A4.

As shown in FIG. 4A, in a display device 112 according to the embodiment, a part of a circuit unit 16 faces a sealing portion 40. Namely, a first substrate unit 10 further includes an interlayer insulating film 15 provided between a first substrate 11 and a display electrode 12, and a circuit unit 16 provided between the first substrate 11 and the interlayer insulating film 15. The circuit unit 16 controls the display electrode 12. An outer edge 16o of the circuit unit 16 is located on the outer side of an inner edge 40i of the sealing portion 40.

A part of the circuit unit 16 faces the sealing portion 40 to narrow the width of a peripheral region 82.

As shown in FIG. 4B, also in a display device 113 according to the embodiment, a part of a circuit unit 16 faces a sealing portion 40. In this example, an outer edge 16o of the circuit unit 16 is located on the outer side of an outer edge 40o of the sealing portion 40. Thus, it is possible to further narrow the width of a peripheral region 82.

In the display devices 112 and 113, since the circuit unit 16 is covered with a first insulating layer 18 containing polysiloxane, the normal operation of the circuit unit 16 can be secured. The entry of water or the like into a display layer 30 through the circuit unit 16 is suppressed.

In the display devices 112 and 113, an outer edge 15o of the interlayer insulating film 15 is located on the inner side of the inner edge 40i of the sealing portion 40. In the embodiment, although the interlayer insulating film 15 is covered with the first insulating layer 18, the first insulating layer 18 sometimes insufficiently covers the interlayer insulating film 15 due to variations or the like in the process steps, for example. In this covering, the relatively thick interlayer insulating film 15 is provided apart from the sealing portion 40 to suppress the entry of water or the like into the display layer 30 through the interlayer insulating film 15. Thus, it is possible to suppress display unevenness due to variations or the like in the process steps.

As shown in FIG. 4C, in a display device 114 according to the embodiment, an outer edge 15o of an interlayer insulating film 15 is located on the outer side of an outer edge 40o of a sealing portion 40. In this configuration, the thickness of the sealing portion 40 along the Z-axis can be reduced. Thus, it is possible to suppress the entry of water or the like into a display layer 30 through the sealing portion 40. It is noted that also in the display device 114, the outer edge 15O of the interlayer insulating film 15 is located on the inner side of an outer edge 18O of a first insulating layer 18, and the interlayer insulating film 15 is covered with the first insulating layer 18. Thus, it is possible to obtain high reliability.

In the display devices 110 to 114 according to the embodiment, it is possible to reduce the numbers of films, layers, and the interfaces therebetween exposed at the end of the substrate unit. Thus, it is possible to obtain high reliability.

It is noted that there is a configuration in which a reinforcing layer is formed on the cut surface of a glass substrate with a fluorine polymer material. However, in this configuration, since the reinforcing layer is individually formed on the end surfaces of a display device, the process steps are complicated, and productivity is poor.

On the contrary, in the display devices according to the embodiment, the insulating layer having the function of an alignment film (the first insulating layer 18 and the second insulating layer 28) is formed on the major surface of a substrate to be a base of a plurality of display devices, whereby it is possible to collectively manufacture a plurality of display devices. Accordingly, it is possible to maintain high productivity.

In the embodiment, for example, the first insulating layer 18 is the uppermost surface in the first substrate unit 10 except portions where the terminal portion 13 and the first connecting portion 16cp are exposed. For example, the second insulating layer 28 is the uppermost surface in the second substrate unit 20 except portions where the second connecting portion 22cp is exposed. The first insulating layer 18 and the second insulating layer 28 of the uppermost surfaces are coupled with the sealing portion 40, whereby it is possible to obtain high reliability.

Second Embodiment

Since the plan configuration of a display device according to a second embodiment and the configuration of a display region 81 can be formed as similar in the first embodiment, the description is omitted. For the display device according to the embodiment, portions different from those in the first embodiment will be mainly described.

Figure 5A:
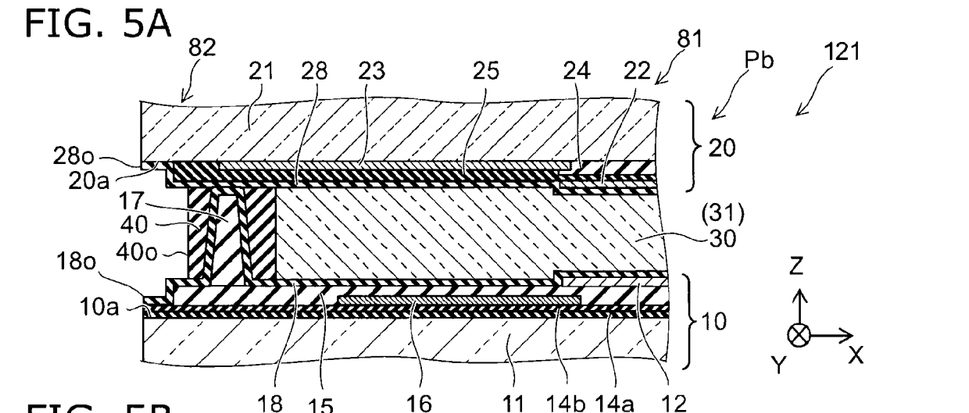
FIG. 5A to FIG. 5C are schematic cross-sectional views illustrating the configuration of display devices according to a second embodiment.
Figure 5B:
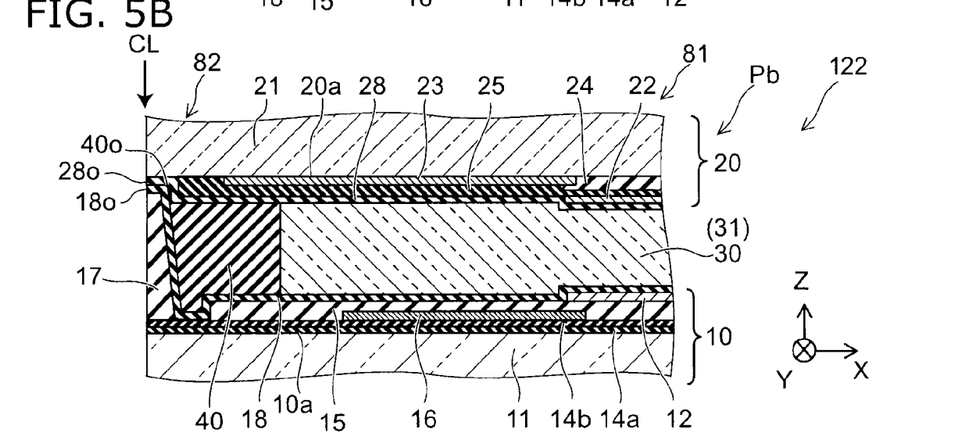
Figure 5C:
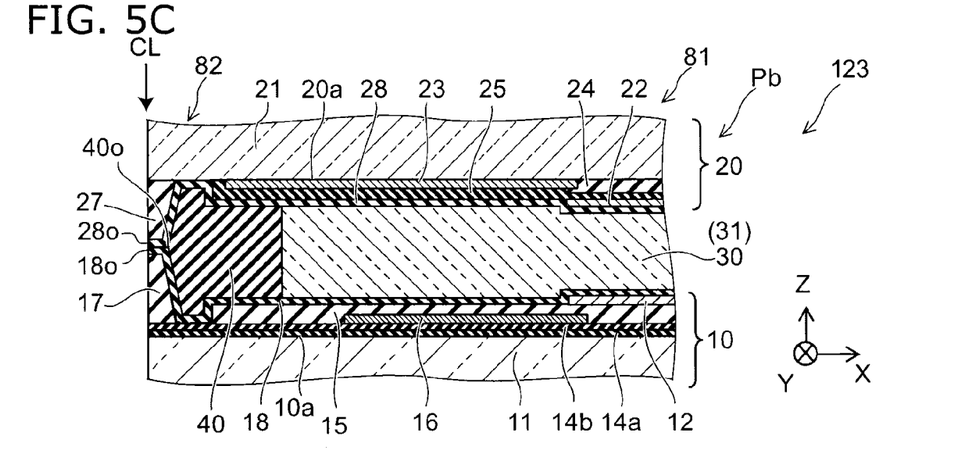

FIG. 5A to FIG. 5C are schematic cross-sectional views illustrating the configuration of the display devices according to the second embodiment.

These drawings are diagrams corresponding to the second portion Pb in FIG. 2A, and corresponding to the cross section on the line A3-A4.

As shown in FIG. 5A, in a display device 121 according to the embodiment, a first substrate unit 10 further includes a first distance control portion 17. The first distance control portion 17 is provided on a first major surface 10a. The first distance control portion 17 controls a distance between the first substrate unit 10 and a second substrate unit 20, for example.

For the first distance control portion 17, a material such as an acrylic resin or polyimide resin, for example, can be used. The first distance control portion 17 is provided in a peripheral region 82.

However, the first distance control portion 17 may also be provided in a display region 81. In this case, the first distance control portion 17 is disposed between a plurality of display electrodes 12, for example.

A first insulating layer 18 covers at least a part of the first distance control portion 17. Namely, also in this case, the first insulating layer 18 is the uppermost surface in the first substrate unit 10 except portions where a terminal portion 13 and a first connecting portion 16cp are exposed. The first insulating layer 18 of the uppermost surface is coupled with a sealing portion 40, whereby it is possible to obtain high reliability.

In the display device 121, a part (at least a part) of the first distance control portion 17 is surrounded by the sealing portion 40. For example, the first distance control portion 17 is provided in a frame shape along the sealing portion 40. Thus, it is possible to suppress the entry of water or the like into a display layer 30 through the sealing portion 40.

It is noted that the first distance control portion 17 can be provided so as to fully surround the entire perimeter of the display layer 30 along the sealing portion 40. Thus, it is possible to suppress the entry of water or the like into the display layer 30 externally at the entire perimeter of the display layer 30. However, the embodiment is not limited thereto. The first distance control portion 17 may be discontinuous. Since it is possible to suppress the entry of water or the like into the display layer 30 in the portion where the first distance control portion 17 is provided, it is possible to improve reliability.

As shown in FIG. 5B, also in a display device 122 according to the embodiment, a first substrate unit 10 includes a first distance control portion 17, and a first insulating layer 18 covers the first distance control portion 17. A part (at least a part) of the side face of the first distance control portion 17 is exposed on an end surface non-parallel (for example, vertical) to a first major surface 10a of the first substrate unit 10.

This configuration can be obtained from a configuration in which, for example, a first base substrate to be a plurality of first substrate units 10 and a second base substrate to be a plurality of second substrate units 20 are used to collectively assemble a plurality of display devices 122 and the first base substrate and the second base substrate are cut between the plurality of display devices 122. Namely, the first distance control portion 17 is disposed at a location corresponding to a cut line CL in the cutting process step, and the first distance control portion 17 is separated in the cutting process step. Thus, the configuration illustrated in FIG. 5B can be obtained.

Also in the display device 122, for example, the first distance control portion 17 is provided continuously or discontinuously in a frame shape along the sealing portion 40, whereby it is possible to suppress the entry of water or the like into the display layer 30 through the sealing portion 40.

As shown in FIG. 5C, in a display device 123 according to the embodiment, a second substrate unit 20 further includes a second distance control portion 27. The second distance control portion 27 is provided on a second major surface 20a. The second distance control portion 27 controls a distance between a first substrate unit 10 and the second substrate unit 20. A second insulating layer 28 covers at least a part of the second distance control portion 27. For the second distance control portion 27, a material such as an acrylic resin or polyimide resin, for example, can be used. For the second distance control portion 27, a color layer 24 may be used. In using the color layer 24, a plurality of color layers 24 with different colors laid on each other may be used for the second distance control portion 27.

In this example, the second distance control portion 27 contacts a first distance control portion 17 through a first insulating layer 18 and the second insulating layer 28. However, the embodiment is not limited thereto. In the case where the second distance control portion 27 is provided, the first distance control portion 17 may not be provided. In this case, the second distance control portion 27 contacts the first substrate unit 10 (the first insulating layer 18, for example) through the second insulating layer 28.

The second distance control portion 27 is provided continuously or discontinuously in a frame shape along a sealing portion 40, whereby it is possible to suppress the entry of water or the like into a display layer 30 through the sealing portion 40.

In the display device 123, a part (at least a part) of the side face of the second distance control portion 27 is exposed on an end surface non-parallel (for example, vertical) to the second major surface 20a of the second substrate unit 20. Also in this case, the second distance control portion 27 is disposed at a location corresponding to a cut line CL in the cutting process step, and the second distance control portion 27 is separated in the cutting process step. Thus, the configuration shown in FIG. 5C can be obtained.

It is noted that at least a part of the second distance control portion 27 may be surrounded by the sealing portion 40.

The display devices according to the first and second embodiments include an array substrate (the first substrate unit 10, for example), a counter substrate (the second substrate unit 20, for example), the display layer 30, and the sealing portion 40, for example. The array substrate has the plurality of signal lines Ln2 and the plurality of scanning lines Ln1 disposed on the first major surface 10a of the first substrate 11 as crossing each other. The counter substrate is disposed as facing the array substrate. The first insulating layer 18 is the topmost layer in the array substrate. The second insulating layer 28 is the topmost layer in the counter substrate. The first insulating layer 18 is disposed on the topmost layer of the array substrate except an OLB pad portion (the terminal portion 13) of the array substrate. The second insulating layer 28 is disposed on the topmost layer of the counter substrate except the transfer portion (the second connecting portion 22cp) of the second substrate 21.

Various films or layers are provided on the first substrate unit 10 and the second substrate unit 20. In these films or layers, the adhesion between the individual films and layers is sometimes low in order to obtain the functions of the films and layers. In the case of a low adhesion, the films and layers are covered with the first insulating layer 18 and the second insulating layer 28, whereby it is possible to obtain high reliability.

Third Embodiment

Figure 6A:
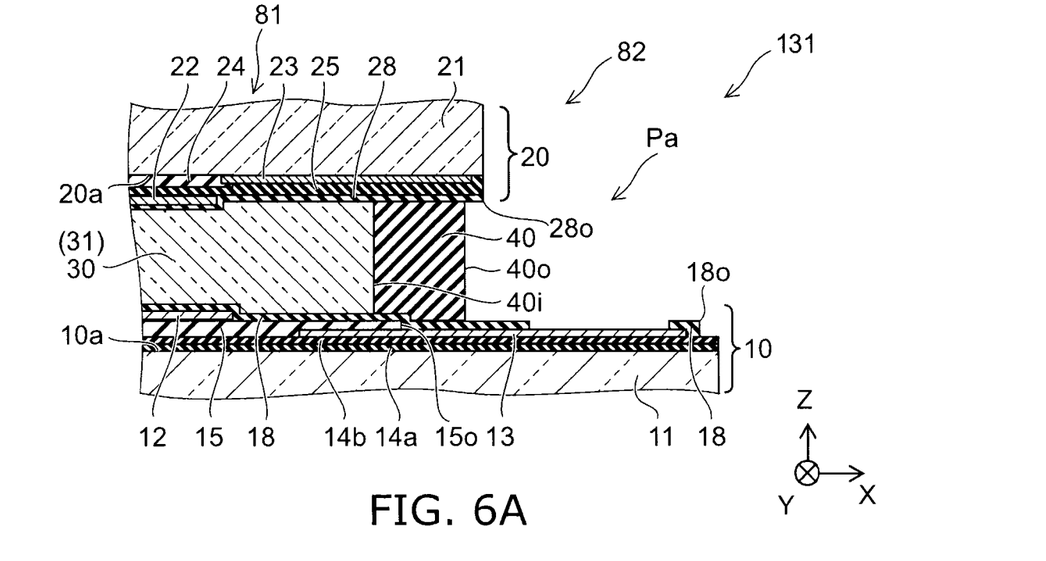
FIG. 6A and FIG. 6B are schematic cross-sectional views illustrating the configuration of a display device according to a third embodiment.
Figure 6B:
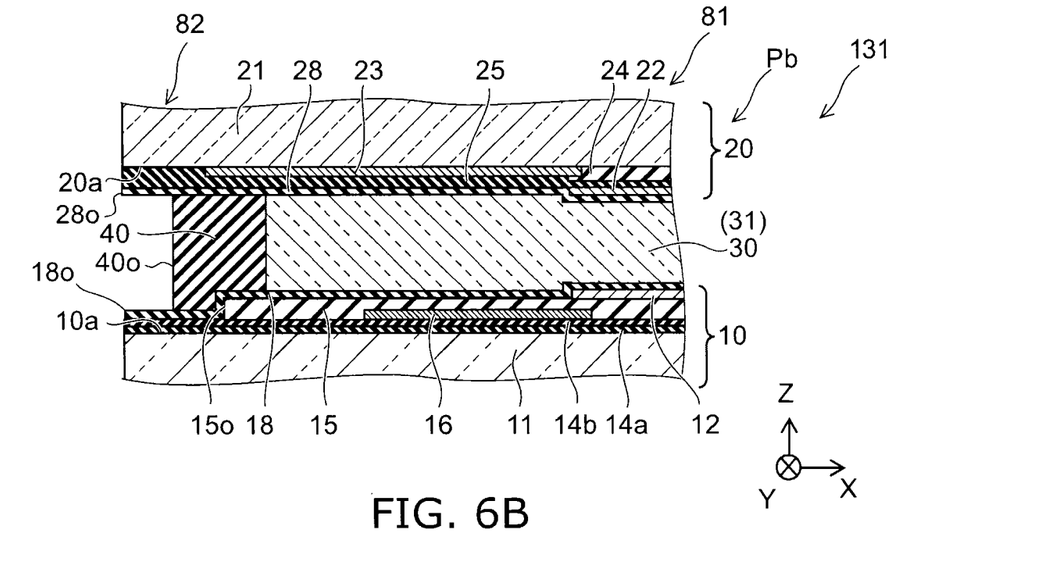
Figure 7A:
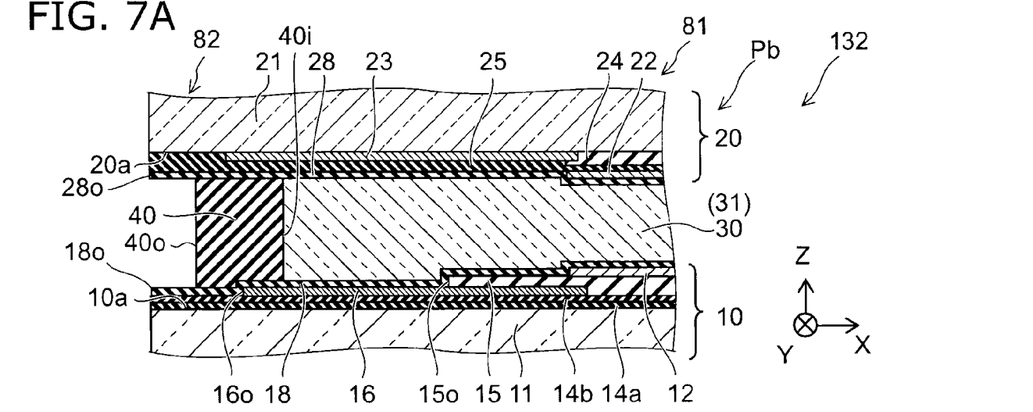
FIG. 7A to FIG. 7C and FIG. 8A to FIG. 8C are schematic cross-sectional views illustrating the configurations of other display devices according to the third embodiment.
Figure 7B:
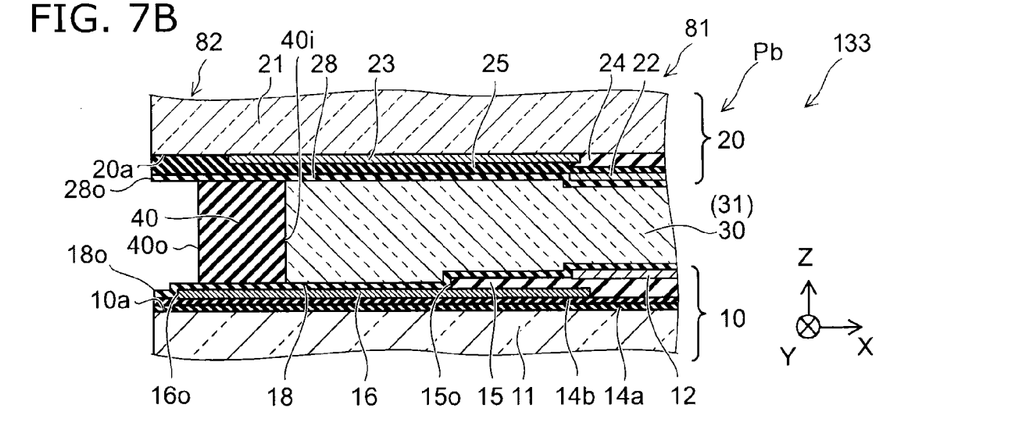
Figure 7C:
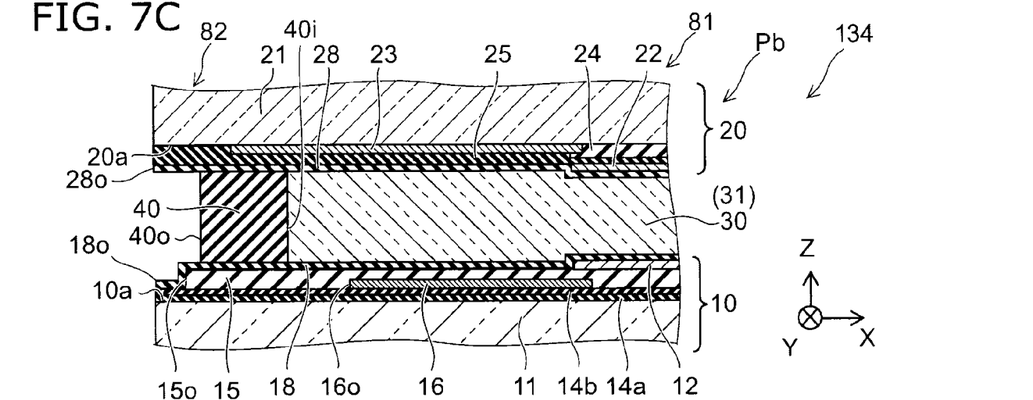
Figure 8A:
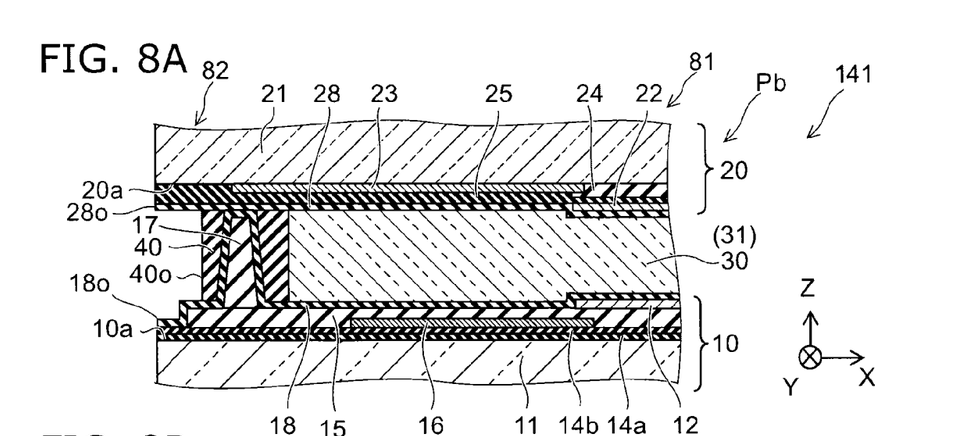
Figure 8B:
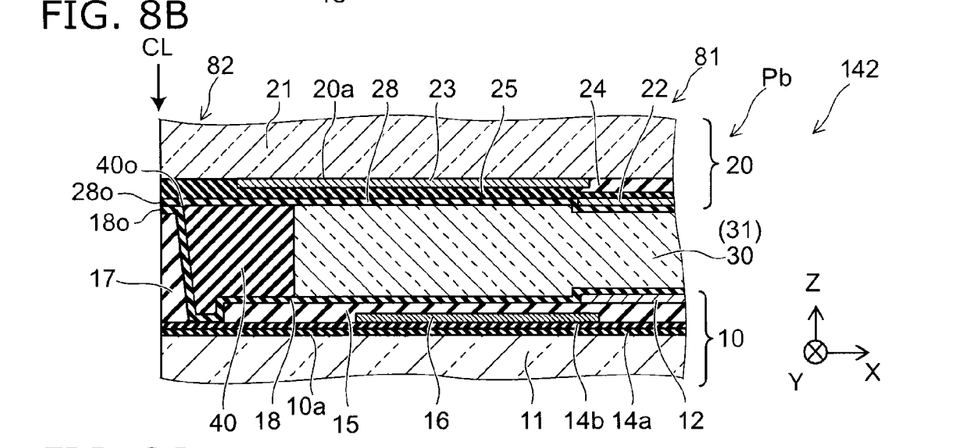
Figure 8C:
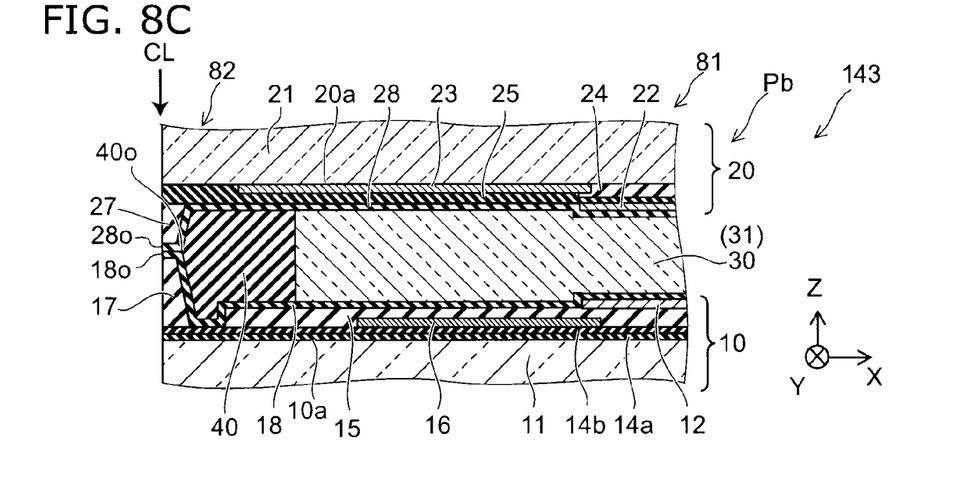

FIG. 6A and FIG. 6B are schematic cross-sectional views illustrating the configuration of a display device according to a third embodiment.

A part of the configuration of a display device 131 according to the embodiment is different from the configuration of the display device 111 already described. In the following, different portions will be described. FIG. 6A is a diagram corresponding to the first portion Pa, and FIG. 6B is a diagram corresponding to the second portion Pb.

As shown in FIG. 6A and FIG. 6B, in the display device 131, an overcoat layer 25 of a second substrate unit 20 extends to the end of a second substrate 21. A second insulating layer 28 covers the top surface (the surface) of the overcoat layer 25. A sealing portion 40 contacts the second insulating layer 28, and does not contact the overcoat layer 25.

Also in this configuration, it is possible to suppress the entry of water or the like (including conductive impurities or the like) into a display layer 30 from the outer side of the sealing portion 40. Accordingly, it is possible to obtain a highly reliable display device.

FIG. 7A to FIG. 7C and FIG. 8A to FIG. 8C are schematic cross-sectional views illustrating the configurations of other display devices according to the third embodiment.

These drawings are diagrams corresponding to the second portion Pb.

As shown in FIG. 7A to FIG. 7C and FIG. 8A to FIG. 8C, in display devices 132, 133, 134, 141, 142, and 143 according to the embodiment, an overcoat layer 25 of a second substrate unit 20 extends to the end of a second substrate 21. Configurations other than this configuration are the same as the configurations of the display devices 112, 113, 114, 121, 122, and 123 already described.

Also in these display devices, it is possible to obtain a highly reliable display device.

According to the embodiment, it is possible to provide a highly reliable display device.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

As described above, the embodiments of the invention are described with reference to specific examples. However, the embodiments of the invention are not limited to these specific examples. For example, the specific configurations of the components such as the first substrate, the second substrate, the first substrate unit, the second substrate unit, the first insulating layer, the second insulating layer, the display electrode, the terminal portion, the counter electrode, the display layer, the liquid crystal layer, the first distance control portion, the second distance control portion, and the like included in the display device are incorporated in the scope of the invention as long as a person skilled in the art appropriately selects components from the publicly known range to similarly implement the invention for obtaining the similar effect.

Further, any two or more components of the specific examples may be combined within the extent of technical feasibility and are included in the scope of the invention to the extent that the purport of the invention is included.

Moreover, all display devices practicable by an appropriate design modification by one skilled in the art based on the display devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device comprising:
   a first substrate unit including:
      a first substrate having a first major surface, the first major surface having a display region and a peripheral region on an outer side of the display region;
      a display electrode provided in the display region;
      a terminal portion provided in the peripheral region and directly or indirectly electrically connected to the display electrode; and
      a first insulating layer provided on the display region and the peripheral region, the first insulating layer covering the display electrode while exposing at least a part of the terminal portion;
   a second substrate unit facing the first major surface, the second substrate unit including:
      a second substrate having a second major surface, the second major surface facing the first major surface; and
      a second insulating layer provided on the second major surface;
   a display layer provided between the display electrode and the second substrate unit;
   a sealing portion provided between the first substrate unit and the second substrate unit, the sealing portion surrounding the display layer and contacting the first insulating layer, an outer edge of the sealing portion being located on an inner side of an outer edge of the first insulating layer; and
   a distance control portion provided between the first substrate and the second substrate, the distance control portion controlling a distance between the first substrate and the second substrate, wherein
   the display layer includes a liquid crystal layer,
   the first insulating layer contains a first polysiloxane including an organic group, the first insulating layer aligning liquid crystals in the liquid crystal layer,
   the first insulating layer directly contacts the liquid crystal layer in the display region,
   the first insulating layer directly contacts the sealing portion in the peripheral region,
   the second insulating layer contains a second polysiloxane including an organic group, the second insulating layer aligning the liquid crystals,
   the distance control portion includes a side face along a plane crossing the first major surface,
   at least one of the first insulating layer and the second insulating layer directly contacts the side face,
   the at least one of the first insulating layer and the second insulating layer is disposed between the side face and the sealing portion, and
   the at least one of the first insulating layer and the second insulating layer directly contacts the sealing portion between the side face and the sealing portion.

2. The device according to claim 1, wherein
the first substrate unit further includes an interlayer insulating film provided between the first substrate and the display electrode, and
an outer edge of the interlayer insulating film is located on an inner side of the outer edge of the sealing portion.

3. The device according to claim 2, wherein the outer edge of the interlayer insulating film is located on an inner side of an inner edge of the sealing portion.

4. The device according to claim 2, wherein the interlayer insulating film includes an acrylic resin.

5. The device according to claim 1, wherein
the first substrate unit further includes
an interlayer insulating film provided between the first substrate and the display electrode, and
a circuit unit provided between the first substrate and the interlayer insulating film and configured to control the display electrode, and
an outer edge of the circuit unit is located on an outer side of an inner edge of the sealing portion.

6. The device according to claim 5, wherein at least a part of the circuit unit faces the sealing portion.

7. The device according to claim 1, wherein at least a part of the distance control portion is surrounded by the sealing portion.

8. The device according to claim 1, wherein the distance control portion fully surrounds an entire perimeter of the display layer along the sealing portion.

9. The device according to claim 1, wherein the distance control portion has a frame shape along the sealing portion.

10. The device according to claim 1, wherein
the second substrate unit further includes a counter electrode provided on the second major surface, and
the second insulating layer covers the counter electrode.

11. The device according to claim 1, wherein
the first substrate unit further includes
an interconnection provided on the first major surface, and
a switching element provided on the first major surface and connected to the interconnection, and
the terminal portion is electrically connected to the display electrode through the interconnection and the switching element.

12. The device according to claim 1, wherein a thickness of the first insulating layer is 10 nanometers or more and 1,000 nanometers or less.

13. The device according to claim 1, wherein a thickness of the first insulating layer is 50 nanometers or more and 2,000 nanometers or less.

14. The device according to claim 1, wherein the sealing portion includes at least one of a thermosetting resin and a UV hardening resin.

15. The device according to claim 1, wherein the second insulating layer directly contacts the liquid crystal layer in the display region.

* * * * *